United States Patent
Rodriguez et al.

(10) Patent No.: US 9,099,544 B2
(45) Date of Patent: Aug. 4, 2015

(54) RAM MEMORY POINT WITH A TRANSISTOR

(71) Applicants: UNIVERSIDAD DE GRANADA, Granada (ES); CENTRE NATIONAL DE LA RECHERCHE SCIENTIFIQUE, Paris Cedex (FR)

(72) Inventors: Noel Rodriguez, Armilla (ES); Francisco Gamiz, Armilla (ES); Sorin Ioan Cristoloveanu, Seyssinet (FR)

(73) Assignees: UNIVERSIDAD DE GRANADA, Granada (ES); CENTRE NATIONAL DE LA RECHERCHE SCIENTIFIQUE, Paris Cedex (FR)

( * ) Notice: Subject to any disclaimer, the term of this patent is extended or adjusted under 35 U.S.C. 154(b) by 0 days.

(21) Appl. No.: 14/349,852

(22) PCT Filed: Oct. 4, 2012

(86) PCT No.: PCT/FR2012/052246
§ 371 (c)(1),
(2) Date: Apr. 4, 2014

(87) PCT Pub. No.: WO2013/050707
PCT Pub. Date: Apr. 11, 2013

(65) Prior Publication Data
US 2014/0299835 A1 Oct. 9, 2014

(30) Foreign Application Priority Data
Oct. 4, 2011 (FR) .................... 11 58942

(51) Int. Cl.
*H01L 29/775* (2006.01)
*H01L 29/78* (2006.01)
(Continued)

(52) U.S. Cl.
CPC ........... *H01L 29/775* (2013.01); *G11C 11/404* (2013.01); *H01L 21/845* (2013.01);
(Continued)

(58) Field of Classification Search
CPC .............................. H01L 29/775; H01L 29/78
USPC ........... 257/288, E27.084, E27.098, E27.099, 257/E29.012, E29.025, E29.17, E29.177; 977/936, 938, 943
See application file for complete search history.

(56) References Cited

U.S. PATENT DOCUMENTS 6,855,606 B2 * 2/2005 Chen et al. ............... 438/283
6,930,343 B2 * 8/2005 Choi et al. ............... 257/296
(Continued)

FOREIGN PATENT DOCUMENTS

| WO | 8808617 A1 | 11/1988 |
| WO | 2010068385 A1 | 6/2010 |
| WO | 2011124855 A1 | 10/2011 |

OTHER PUBLICATIONS

International Search Report dated Jan. 3, 2013 for related PCT application No. PCT/FR2012/052246.
(Continued)

*Primary Examiner* — Ida M Soward
(74) *Attorney, Agent, or Firm* — Howard IP Law Group, PC

(57) ABSTRACT

A memory cell formed of a semiconductor nanorod having its ends heavily doped to form source and drain regions and having its central portion including, between the source and drain regions, an N-type region surrounded on a majority of its periphery with a quasi-intrinsic P-type region, and wherein the P-type region itself is surrounded with an insulated gate.

5 Claims, 2 Drawing Sheets

(51) Int. Cl.
  *G11C 11/404*  (2006.01)
  *H01L 21/84*  (2006.01)
  *H01L 27/108*  (2006.01)
  *H01L 27/12*  (2006.01)
  *H01L 29/06*  (2006.01)

(52) U.S. Cl.
  CPC .... *H01L27/10802* (2013.01); *H01L 27/10805* (2013.01); *H01L 27/10844* (2013.01); *H01L 27/1211* (2013.01); *H01L 29/0657* (2013.01); *H01L 29/78* (2013.01); *H01L 29/7841* (2013.01)

(56) References Cited

U.S. PATENT DOCUMENTS

| | | | | |
|---|---|---|---|---|
| 7,164,181 | B2* | 1/2007 | Osipov et al. | 257/422 |
| 7,382,648 | B2* | 6/2008 | Bockrath | 365/164 |
| 7,482,652 | B1* | 1/2009 | Yang | 257/314 |
| 7,768,825 | B2* | 8/2010 | Kao et al. | 365/175 |
| 7,851,841 | B2* | 12/2010 | Duan et al. | 257/296 |
| 8,097,922 | B1* | 1/2012 | Balandin et al. | 257/369 |
| 2005/0051805 | A1* | 3/2005 | Kim et al. | 257/222 |
| 2005/0121706 | A1* | 6/2005 | Chen et al. | 257/288 |
| 2006/0092739 | A1 | 5/2006 | Fujita et al. | |
| 2006/0158760 | A1* | 7/2006 | Portico Ambrosio et al. | 359/883 |
| 2006/0204428 | A1* | 9/2006 | Noy et al. | 423/445 R |
| 2007/0272951 | A1* | 11/2007 | Lieber et al. | 257/211 |
| 2007/0278572 | A1 | 12/2007 | Ban et al. | |
| 2008/0068876 | A1* | 3/2008 | Sandhu et al. | 365/149 |
| 2008/0173864 | A1* | 7/2008 | Fujita et al. | 257/40 |
| 2008/0272366 | A1* | 11/2008 | Moon et al. | 257/24 |
| 2009/0072223 | A1* | 3/2009 | Awano | 257/24 |
| 2009/0114904 | A1* | 5/2009 | Baik et al. | 257/24 |
| 2009/0278556 | A1* | 11/2009 | Man et al. | 324/693 |
| 2010/0072459 | A1* | 3/2010 | Bertin et al. | 257/24 |
| 2010/0149864 | A1 | 6/2010 | Ertosun et al. | |
| 2011/0133161 | A1* | 6/2011 | Bangsaruntip et al. | 257/24 |
| 2011/0156133 | A1* | 6/2011 | Appenzeller et al. | 257/327 |
| 2011/0168968 | A1* | 7/2011 | Yang et al. | 257/9 |
| 2011/0180871 | A1 | 7/2011 | Anderson et al. | |
| 2012/0217468 | A1* | 8/2012 | Tekleab et al. | 257/9 |
| 2012/0261646 | A1* | 10/2012 | Zhou et al. | 257/29 |
| 2013/0309826 | A1* | 11/2013 | Ramkumar et al. | 438/269 |

OTHER PUBLICATIONS

Ertosun et al., "Investigation of Capacitorless Double-Gate Single-Transistor DRAM: With and Without Quantum Well", IEEE Transactions on Electron Devices, vol. 57, No. 3, pp. 608-613, Mar. 2010.

Ertosun et al., "Characteristics of the Capacitorless Double Gate Quantum Well Single Transistor DRAM", IEEE, 4 Pages, 2009.

Collaert, N. et al., "Optimizing the Readout Bias for the Capacitorless 1T Bulk FinFET RAM Cell", IEEE Electron Device Letters, vol. 30, No. 12, pp. 1377-1379, Dec. 2009.

Tanaka, T. et al., "Scalability Study on a Capacitorless 1T-DRAM: From Single-gate PD-SOI to Double-gate FinDRAM", IEEE, pp. 37.5.1-37.5.4, 2004.

* cited by examiner

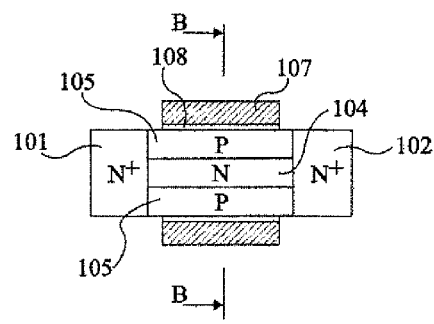
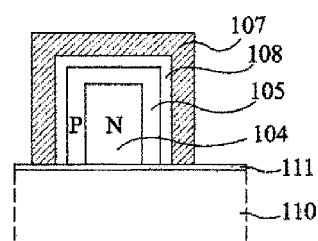
Fig 3A · Fig 3B
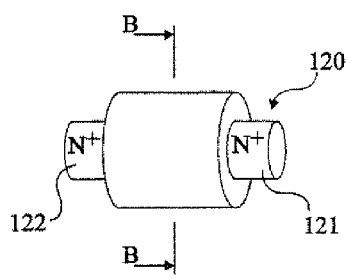
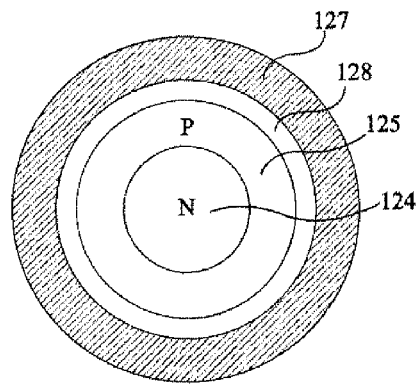
Fig 4A · Fig 4B

RAM MEMORY POINT WITH A TRANSISTOR

CROSS-REFERENCE TO RELATED APPLICATIONS

This application is the national stage application under 35 U.S.C. §371 of International Application No. PCT/FR2012/052246 and claims the benefit of Intl Application No. PCT/FR2012/052246, filed Oct. 4, 2012, and French Application No. 11/58942, filed Oct. 4, 2011, the entire disclosures of which are incorporated herein by reference in their entireties.

FIELD OF THE INVENTION

The present invention relates to a RAM memory cell with one transistor.

BACKGROUND OF THE INVENTION

A memory cell with one transistor has already been described by the present inventors in unpublished French patent application 10/52612 of Jul. 4, 2010 (B10224).

FIG. 1 is a copy of FIG. 1 of this French patent application. The memory cell comprises a MOS transistor formed on an insulating layer 1 resting on a support 3, generally, a silicon plate. The area occupied by the MOS transistor, or active area, is delimited by an insulating periphery 5. The MOS transistor comprises heavily-doped source and drain regions of a first conductivity type 7 and 8 separated by a bulk region. The source and drain regions respectively form one piece with a source metallization 10 and a drain metallization 11 connected to source and drain terminals S and D. The bulk portion of the transistor is topped with an insulated gate 12 connected to a gate terminal G. The bulk region is divided widthwise into an upper bulk region 13 on the side of gate 12 and a lower bulk region 14 in the vicinity of insulating layer 1. Upper bulk region 13 is of the conductivity type opposite to that of the drain/source and preferably has a doping level lower than $10^{16}$ atoms/cm$^3$. Lower bulk region 14 is of the same conductivity type as the drain/source. Its doping level is preferably selected to be in a range from $10^{16}$ to $10^{18}$ atoms/cm$^3$ according to its thickness so that lower portion 14 is fully depleted at state 0 and that it contains a sufficient quantity of available electrons at state 1, states 0 and 1 being defined hereafter.

This French patent application also describes a write and read mode for this memory cell.

To write a 1, a relatively high positive voltage, for example, from 1 to 3 volts, is first applied to the transistor drain, and the gate is set to a positive potential for a short time, while the positive voltage is applied to the drain. As a result, a channel region is formed in the upper bulk region (during this phase, a low proportion of current may without any disadvantage flow through the lower bulk region) while electrons flow from the source to the drain. Given that the drain-source potential difference is selected to be relatively high, these electrons will create by impact electron-hole pairs in the upper bulk region. The created electrons take part in the current flow, and the holes remain in the upper bulk region. If the current flow between source and drain is abruptly interrupted, by switching the gate to a negative potential before switching the drain, holes will remain in upper bulk region 13.

To write a 0 into the memory cell, the gate is made positive again but this time, drain 8 is connected to a slightly positive, zero, or even negative voltage. Then, the source-drain potential difference is insufficient for the creation of electron-hole pairs and, due to the electrostatic biasing created by the gate in upper bulk region 13, the holes that may be present in this upper bulk region will be drained off to the drain and/or to the source. Thus, in one case (writing of a 1), holes are stored in upper bulk region 13 and in the other case (writing of a 0), no charge is stored in this upper bulk region.

In read phase, a negative voltage is applied to the gate and a slightly positive voltage is applied to the drain. In hold phase, a negative voltage is applied to the gate and a zero voltage is applied to the drain.

In the case where a 0 has been stored, that is, no charge is stored in upper bulk region 13, the transistors in parallel sharing a same drain and a same source are both blocked: no current flows through the transistor corresponding to the upper bulk region since the gate is negative, and the negative gate voltage depletes the lower bulk region which thus also lets no current flow. It should be understood that the upper bulk region should be sufficiently thin for the gate to have a sufficient influence on the lower bulk region, whereby it has been indicated that the upper bulk region has a thickness preferably close to 10 nm.

However, in the case where a 1 has been written, that is, positive charges are stored in upper bulk region 13, no current flows through the transistor corresponding to this upper bulk region since the gate is negative and no electric channel region is created in the upper bulk region. However, the positive charges stored in the upper bulk region shield the negative gate potential and an electron current will flow through the transistor having, as a source and drain, regions 7 and 8 and, as a bulk, non-depleted lower bulk region 14.

Thus, a state 1 may be recognized from a state 0 by the flowing of a current or the fact that no current flows during a read phase.

It should also be noted that due to the fact that during the read state, only a slightly positive potential is applied to the drain, no charges are created by impact in lower bulk region 14 during a reading.

FIG. 7 of this patent application is copied in FIG. 2 of the present application. This drawing very schematically illustrates a FINFET embodiment of a variation of the structure of FIG. 1. The transistor bulk, instead of being divided in two regions, is divided in three regions: a left-hand P-type region 41, a central N-type region 43, and a right-hand P-type region 45. An insulated gate 46 is arranged in front of left-hand region 41 and an insulated gate 47 is arranged in front of right-hand region 45. A two-bit memory cell, that is, a four-state memory cell, is thus obtained. The left-hand gate enables to store or not charges in left-hand bulk region 41. The right-hand gate enables to store or not charges in right-hand bulk region 45. A first state (11) is obtained if charges are stored on the left-hand side and on the right-hand side, a second state (00) is obtained if no charge is stored, either on the left-hand side or on the right-hand side, a third state (10) is obtained if charges are stored on the left-band side and not on the right-hand side, and a fourth state (01) is obtained if charges are stored in the right-hand region and not on the left-hand side. States (01) and (10) can be differentiated in various ways. Particularly, if the left-hand and right-hand gates are different (different work function or different insulator thickness) and/or if the applied voltages are different, a variable quantity of charges will be stored in the left-hand bulk region and in the right-hand bulk region on each writing of a 1. Thus, the four possible values of the current in the central bulk region can be well differentiated.

It should be noted that in the embodiment illustrated in FIG. 2, the two gates are distinct and controlled independently to determine different states of the memory cell.

SUMMARY

An object of an embodiment of the present invention is to provide a memory cell structure with one transistor, which is more sensitive than the structure described in the above-mentioned patent application, that is, in particular, which is controllable and which can be maintained in hold mode by lower voltages.

An object of an embodiment of the present invention is to provide such a memory cell having a ratio of the read current at state 1 to the read current at state 0 which is even greater than in prior art devices.

An object of an embodiment of the present invention is to provide such a memory cell which can be even more miniaturized than prior devices and, particularly, which can have a shorter gate length.

An object of an embodiment of the present invention is to provide such a memory cell which can be manufactured in a way compatible with emerging FinFET transistor and nanowire transistor technologies where the gate length is 22 nm or less.

Thus, an embodiment of the present invention provides a memory cell formed of a semiconductor nanorod having ends heavily doped to form source and drain regions and having its central portion comprising, between the source and drain regions, an N-type region surrounded on the most part of its periphery with a quasi-intrinsic P-type region, the P-type region being itself surrounded with an insulated gate.

According to an embodiment of the present invention, the doping level of the N-type region is in the range from $2.10^{18}$ to $2.10^{19}$ atoms per cm$^3$ (i.e. $2\times10^{18}$ to $2\times10^{19}$ atoms per cm$^3$) and the doping level of the P-type region is in the range from $10^{14}$ to $10^{16}$ atoms per cm$^3$.

According to an embodiment of the present invention, the nanorod is formed of a piece of silicon formed in a silicon-on-insulator layer.

According to an embodiment of the present invention, the nanorod is formed of a piece of a silicon nanowire.

According to an embodiment of the present invention, the length of the gate is shorter than the length of the P-type region, that it surrounds.

BRIEF DESCRIPTION OF THE DRAWINGS

The foregoing and other features and advantages will be discussed in detail, in the following non-limiting description of specific embodiments in connection with the accompanying drawings, among which:

FIGS. 3A and 3B respectively are a cross-section view in a longitudinal direction and a cross-section view along plane BB of FIG. 3A of an embodiment of a memory cell with one transistor; and FIGS. 4A and 4B respectively are a perspective view and an enlarged cross-section view along plane BB of FIG. 4A of an embodiment of a memory cell with one transistor.

Figure 1:
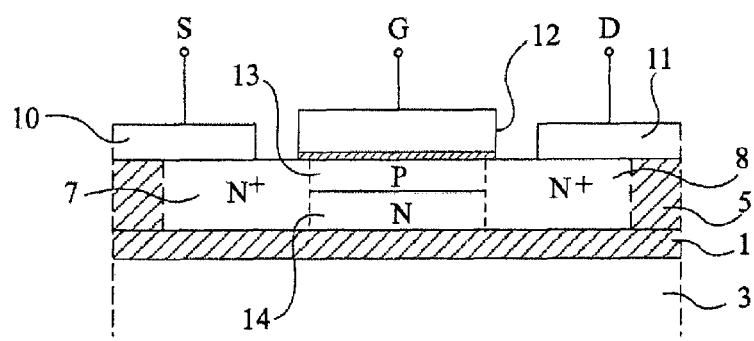
FIGS. 1 and 2, previously described, respectively correspond to FIGS. 1 and 7 of French patent application 10/52612.
Figure 2:
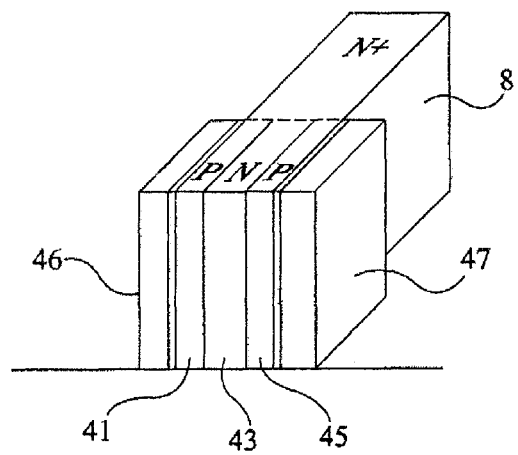

As usual, in the representation of micro- and nano-components, the various drawings are not to scale.

DETAILED DESCRIPTION

FIGS. 3A and 3B respectively are a cross-section view in a longitudinal direction and a cross-section view along plane BB of FIG. 3A of an embodiment of a memory cell with one transistor. The memory cell shown in FIGS. 3A and 3B comprises source and drain regions 101 and 102 separated by an intermediate region comprising a central. N-type region 104 and a surrounding P-type region 105. The P-type portion is itself surrounded with a gate conductor 107 insulated from this P-type region by an insulating layer 108. The embodiment of FIG. 3B is a FINFET-type embodiment formed from a cut portion 104 of a semiconductor layer, itself deposited on a semiconductor substrate 110 coated with an insulating layer 111.

It should be understood that the structure may be simply manufactured by first forming a nanorod (in a cross-section plane perpendicular to the cross-section plane of FIG. 3B) having an N-type doped central portion 104, the nanorod ends being heavily N-type doped (N$^+$) to form source and drain regions 101 and 102. A P-type layer 105 is formed by epitaxy to cover three sides of central portion 104. Then, an insulating layer 108 is formed, for example, by thermal oxidation or by deposition. Finally, a conductive layer forming gate 107 is deposited on the insulating layer.

The memory cell may be programmed by band-to-band (BTB) tunneling, or by impact ionization.

The dimensions from the source to the drain (horizontal in FIG. 3A) will be called "length", the orthogonal dimensions (vertical in FIG. 3A and horizontal in FIG. 3B) will be called "width" or thickness, and the vertical dimensions in the representation of FIG. 3B will be called "height". The device of FIGS. 3A and 3B can then, as an example, have the following dimensions:

length between the drain and source (channel length): 22 nm
    width of N region 104: 20 nm
    thickness of P region 105: 4 nm
    gate oxide thickness: 2 nm
    total width (including the gate): 32 nm.

The above example is given in the context of a technology where the channel length is 22 nm, but may be adapted to the case of future technologies where channel lengths of 14 nm, and then of 11 nm, are envisaged. Indeed, an advantage of the memory cell described herein is that, given the surrounding configuration of the gate, an efficient gate can be kept even for gate lengths much shorter than those which would remain efficient for devices where the gate is simply stacked to the channel region.

According to a preferred embodiment, the central N-type portion of the intermediate region is relatively heavily doped, with a doping level in the range from $2.10^{18}$ to $2.10^{19}$ atoms per cm$^3$, and the peripheral P-type region is a quasi-intrinsic region having a P-type doping level in the range from $10^{14}$ to $10^{16}$ atoms per cm$^3$.

The voltages applied to the drain and to the gate (the source being grounded) may then be the following:

| Operation | Gate voltage | Drain voltage |
| --- | --- | --- |
| Holding | <−1 V | 0 V |
| Reading | <−1 V | 0.1 V |
| Writing of a 0 or deleting | 1 V | 0 V |
| Writing of a 1 | −2 V | 1.2 V |

For the writing of a 1, the gate and drain voltages will be applied in the form of quasi-simultaneous pulses, the duration of the drain pulse being much shorter than that of the gate pulse in the case of a programming by band-to-band tunneling, and conversely in the case of a programming by impact ionization.

FIG. 4A is a perspective view of another embodiment, FIG. 4B being an enlarged cross-section view along plane BB of FIG. 4A. The structure is formed from a semiconductor nanowire. The central portion comprises an N-type region 124 surrounded with a P-type region 125, for example formed by epitaxy, the assembly being surrounded with a conductive layer 127 insulated from P-type region 125 by an insulating layer 128. Ends 121 and 122 are heavily N-type doped (N⁺).

An advantage of the memory cell described herein is that state 1 is stable. However, the holding of a state 0 requires a refreshment. The holding time may however be longer than 100 ms. It should be noted that this holding time is improved if, as illustrated in FIG. 3A, the gate length is shorter than the length of the N region that it surrounds.

An advantage of the memory cell described herein is that its programming, its holding, and its reading can be ensured by particularly low voltages.

Specific embodiments of the present invention have been described. Various alterations and modifications will occur to those skilled in the art. In particular, various materials may be selected to form the gate insulator, particularly silicon oxide, silicon nitride, or materials of high permittivity.

Further, an embodiment of the invention in SOI technology has been described in detail hereinabove, where a silicon nanorod is formed in a thin silicon layer coating an insulating layer 111. According to an alternative embodiment, the silicon nanorod may be defined in an epitaxial silicon layer formed on a silicon substrate (solid substrate). In the context of the embodiment described herein, this substrate will be a P-type substrate and the epitaxial layer will be an N-type layer. It should be noted that in the case of an embodiment on a solid substrate, it is possible for the read current of a 0 not to be strictly zero, but that it will in all cases have a negligible value as compared with the read current of a 1.

What is claimed is:

1. A memory cell formed of a semiconductor nanorod having ends heavily doped to form source and drain regions and having a central portion comprising, between the source and drain regions, an N-type region surrounded on a majority of its periphery with a quasi-intrinsic P-type region, and wherein the P-type region itself is surrounded with an insulated gate.

2. The memory cell of claim 1, wherein the doping level of the N-type region is in the range from $2.10^{18}$ to $2.10^{19}$ atoms per cm³ and the doping level of the P-type region is in the range from $10^{14}$ to $10^{16}$ atoms per cm³.

3. The memory cell of claim 1, wherein the nanorod is formed of a piece of silicon formed in a silicon-on-insulator layer.

4. The memory cell of claim 1, wherein the nanorod is formed of a piece of a silicon nanowire.

5. The memory cell of claim 1, wherein the length of the insulated gate is shorter than the length of the P-type region that it surrounds.

* * * * *